United States Patent [19]

Fujishima et al.

[11] Patent Number: 4,914,630
[45] Date of Patent: Apr. 3, 1990

[54] REFRESH ARRANGEMENT IN A BLOCK DIVIDED MEMORY INCLUDING A PLURALITY OF SHIFT REGISTERS

[75] Inventors: Kazuyasu Fujishima; Yoshio Matsuda; Hideto Hidaka, all of Hyogo, Japan

[73] Assignee: Mitsubishi Denki Kabushiki Kaisha, Tokyo, Japan

[21] Appl. No.: 192,714

[22] Filed: May 11, 1988

[30] Foreign Application Priority Data

May 15, 1987 [JP] Japan .............................. 62-119213

[51] Int. Cl.$^4$ .............................................. G11C 7/00
[52] U.S. Cl. ......................... 365/189.04; 365/189.12; 365/222; 365/230.03
[58] Field of Search ............... 365/230, 233, 239, 240, 365/78, 222, 189, 230.03, 230.05, 189.04, 189.12

[56] References Cited

U.S. PATENT DOCUMENTS

| | | | |
|---|---|---|---|
| 4,044,339 | 8/1977 | Berg | 365/240 |
| 4,330,852 | 5/1982 | Redwine et al. | 365/240 |
| 4,486,860 | 12/1984 | Takemae et al. | 365/222 |
| 4,541,075 | 9/1985 | Dill et al. | 365/189 |
| 4,680,738 | 7/1987 | Tam | 365/239 |
| 4,725,987 | 2/1988 | Cates | 365/222 |
| 4,758,993 | 7/1988 | Takemae | 365/222 |

FOREIGN PATENT DOCUMENTS 0000696 1/1985 Japan .................. 365/222

OTHER PUBLICATIONS

IEEE J. of Sol. St. Circuits: "A High Speed Dual Port Memory with Simultaneous Serial and Random Mode Access for Video Applications", by Raymond Pinkham et al., vol. SC-19, No. 6, Dec. 1984, pp. 999–1007.

Primary Examiner—Glenn A. Gossage
Attorney, Agent, or Firm—Lowe, Price, LeBlanc, Becker & Shur

[57] ABSTRACT

In a block access memory, the memory cell array is divided into a plurality of blocks, one word line is selected based on the external address and the access to the memory cells connected thereto is carried out in one block and, simultaneously, one word line is selected based on the internally generated refresh address and the refresh of the memory cells connected to the word line is carried out in the other block.

10 Claims, 5 Drawing Sheets

REFRESH ARRANGEMENT IN A BLOCK DIVIDED MEMORY INCLUDING A PLURALITY OF SHIFT REGISTERS

BACKGROUND OF THE INVENTION

1. Field of the Invention

The present invention relates to a block access memory and, more specifically, it relates to an improved accessing for enhancing an operating efficiency of a block access memory.

2. Description of the Prior Art

Recently, a semiconductor memory device has come to be implemented with larger capacity and it has been desired to enhance the data transfer rate in order to provide high speed operation. In order to improve the data transfer rate, a block access memory as shown in FIG. 1 has come to be used in which data input/output is carried out serially between the shift register and a data input/output portion, and data transfer is simultaneously carried out between the shift register and an entire row of memory cells (memory cells connected to one word line).

Referring to FIG. 1, a conventional block access memory comprises an address buffer 7 which receives externally applied external address signals A0 to A7 and generates complementary address signals A0, $\overline{A0}$ to A7, $\overline{A7}$; a refresh address counter 8 which successively generates refresh row addresses for designating the row to be refreshed; a REF buffer 9 which receives an externally applied external refresh signal Ext. REF for designating the refresh cycle and generates signals REF and $\overline{REF}$ for transmitting either the complementary address A0 to A7, $\overline{A0}$ to $\overline{A7}$ or the refresh row address from the refresh address counter 8; a switch SW1 which turns on in response to the signal $\overline{REF}$ from the REF buffer 9 for transmitting an output of the address buffer 7 to the row decoder 1; a switch SW2 which turns on in response to the signal REF from the REF buffer 9 for transmitting the refresh row address from the refresh address counter 8 to the row decoder 1; a row decoder 1 which receives and decodes a row address applied from the address buffer 7 or from the refresh address counter 8 and selects accordingly one word line; a plurality of memory cells 4 arranged in rows and columns, each storing information; a plurality of word lines 2 for selecting one row of the plurality of memory cells 4; a plurality of bit lines 3 to each of which is transmitted the information of a memory cell connected to the word line which is in turn selected by the output of the row decoder 1; a sense amplifier group 5 provided corresponding to each of the bit lines 3 for detecting/amplifying the information on the bit lines; a shift register 6 which simultaneously receives the signals from the sense amplifier group 5 in response to the clock signal Φ20 and transmits the received data successively to the data output buffer 10 in response to clock signals Φ1 and Φ2; and an output buffer 10 which outputs the information from the shift register 6 serially as the output data D$_{OUT}$. In FIG. 1, the memory cell array MA is structured with 256 rows × 256 columns as an example. The shift register 6 has its output portion and the input portion connected together to form a loop. The sense amplifier group 5 is activated in response to the sense amplifier activating signal $\overline{SE}$.

FIG. 2 shows the structure of the sense amplifier group 5 and the shift register 6 shown in FIG. 1 in more detail. Referring to FIG. 2, the sense amplifier group 5 is constituted by 256 sense amplifiers 5-1 to 5-256 provided corresponding to each of the bit line pairs. Each of the sense amplifiers 5-1 to 5-256 is constituted by two switch transistors Tr1 and Tr2 having their gates and drains cross connected and is activated in response to the sense amplifier activating signal $\overline{SE}$ to differentially amplify the potential on the bit lines using the level of a bit line to which the non-selected memory cell is connected as a reference potential, and outputs a potential on the bit line BL. As for the bit lines, a bit line to which a selected memory cell is connected and a reference bit line which applies the comparison reference potential with respect to the potential on that bit line are arranged in pairs. The shift register 6 is constituted by 256 stages of unit shift registers 6-1 to 6-256. Each of the unit shift registers 6-1 to 6-256 is constituted by two stage inverters I1 and I2 and a switch transistor T1 connected between these inverters and which turns on in response to the clock signal Φ1. A switching transistor T2 which turns on in response to the clock signal Φ2 is provided between adjacent unit shift registers. The outputs of the sense amplifiers 5-1 to 5-256 are transmitted to the input portions of respective unit shift registers 6-1 to 6-256 through the switching transistors 11-1 to 11-256 which turn on in response to the clock signal Φ20.

FIG. 3 is a waveform diagram showing the data reading operation in a conventional block access memory shown in FIG. 1. The operation of a conventional block access memory will be hereinafter described with reference to FIGS. 1 to 3.

First, for example, an external $\overline{RAS}$ signal (not shown) which is a basic operation timing signal becomes activated and external address signals A0 to A7 are taken into the memory chip and applied to the address buffer 7. In the normal data reading cycle, the external refresh signal Ext. REF is at a low level. Therefore, the signal $\overline{REF}$ is at a high level, the signal REF is at the low level, and the switch SW1 is turned on while the switch SW2 is turned off. The complementary addresses A0, $\overline{A0}$ to A7, $\overline{A7}$ generated in the address buffer 7 are transmitted to the row decoder 1 through the switch SW1. Thereafter, one word line is selected by the row decoder 1 which is designated by the address signals A0, $\overline{A0}$ to A7, $\overline{A7}$, the potential of the selected word line WL rises and one row of memory cells is selected. Consequently, the potential change corresponding to the information contained in the memory cell connected to the selected word line WL appears on each of the bit lines 3. Thereafter, the sense amplifier activating signal $\overline{SE}$ falls and the sense amplifier group 5 (5-1 to 5-256 of FIG. 2) is activated and differentially amplifies the potential on each bit line pair BL and $\overline{BL}$ using the level bit line to which the non-selected memory cell is connected as a reference potential. Then, the clock signal Φ20 rises and the switch transistors 11-1 to 11-256 turn on and the information from each of the sense amplifiers 5-1 to 5-256 is simultaneously transmitted to the input portion of each of the unit shift registers 6-1 to 6-256 of the shift register 6. The information transmitted to the shift register 6 is successively transmitted to the data output buffer 10 serially bit by bit in response to the clock signals Φ1 and Φ2, and the serial 256 bit data is read through the data output buffer 10 as the output data D$_{OUT}$. When one cycle (serial read cycle) is completed, the potential of the selected word line WL falls and the sense amplifier activating signal $\overline{SE}$ rises, and the external refresh signal Ext. REF becomes high level so that the signal REF becomes high level and the signal $\overline{REF}$ becomes low level. Consequently, the refresh row address from the refresh address counter 8 is transmitted to the row decoder 1 through the switch SW2, thereby starting the refresh cycle. One word line is selected corresponding to the refresh row address which is decoded by the row decoder 1, the selected word line level rises and the information contained in the memory cells connected to the selected word line is transmitted to respective bit lines. Thereafter, the sense amplifier activating signal $\overline{SE}$ becomes low level and the sense amplifier group 5 is activated to differentially amplify the potential difference on each bit line pair, establishing the potential level on the bit lines 3. Thereafter, by lowering the potential of the selected word line, the potential level on each bit line is re-written in each memory cell, and the refresh of the memory cell information is completed. On this occasion, the refresh address counter 8 outputs a refresh row address and applies the same to the row decoder 1 and thereafter increments or decrements the address.

The operation timing of the refresh address counter 8 is given by, for example, the signal REF and the increment or decrement of the refresh row address is automatically carried out in the counter 8.

The data writing cycle is carried out with the same timing as in the data reading and data is serially inputted to the shift register 6 from a data input buffer, which is not shown. As for the operation in data writing, the operation timing is similar to that in reading, except that the flow of the stream of data is reversed to that in the reading. Namely, the description of the operation of data reading is directly applied when the reading buffer 10 of FIG. 1 is replaced with a writing (or data input) buffer and the data is assumed to flow from the writing buffer to the shift register and to the memory cells of one row.

Since a conventional block access memory is structured as described above, a refresh cycle must be interposed between the normal data reading cycle or the data writing cycle in order to refresh the memory cells, so that the operating efficiency of the block access memory is lowered.

A memory device in which the data transfer is carried out between memory cells of one row and the shift register is disclosed in U.S. Pat. No. 4,541,075 to Dill et al., entitled "RANDOM ACCESS MEMORY HAVING A SECOND INPUT/OUTPUT PORT", U.S. Pat. No. 4,044,339 to Berg, entitled "BLOCK ORIENTED RANDOM ACCESS MEMORY" and in an article "A High Speed Dual Port Memory with Simultaneous Serial and Random Mode Access for Video Applications" by R. PINKHAM et al., IEEE Journal of Solid-State Circuits Vol. SC-19, No. 6, December 1984, pp. 999–1007.

These prior arts disclose a structure in which serial data transfer is carried out between the shift register and the exterior and the simultaneous data transfer of all of the data bits is carried out between the shift register and the memory cells of one row in the DRAM. However, there is no consideration for the existence of a refresh cycle which is an essential operation cycle in the DRAM in these references.

SUMMARY OF THE INVENTION

An object of the present invention is to prevent the above described lowering of efficiency in utilizing the memory due to the refresh cycle in a conventional block access memory.

The specific object of the present invention is to provide a block access memory which is capable of refreshing each memory cell without interposing a special cycle as a refresh cycle between the normal access (writing and reading) cycles.

Another specific object of the present invention is to provide a method for driving the block access memory which enables refreshing of each memory cell without providing a special operation cycle as a refresh cycle.

In the block access memory of the present invention, the memory cell array is divided into a plurality of blocks, the data reading or writing is carried out by selecting and accessing a word line in each block in response to the external address and the word lines of the not-accessed blocks are selected by the output of the refresh address counter to carry out refreshing in parallel to the access of the selected blocks.

In the block access memory of the present invention, the reading or writing of data is carried out in a block by block access manner, and the refreshing is carried out by selecting a word line in the non-selected blocks by the output of the refresh address counter in parallel to the access of the selected block, so that the refresh cycle simultaneously occurs with the read cycle or the write cycle for normal data reading or writing. Therefore, there is no need for providing a special cycle for refreshing in the block access memory, whereby the operating efficiency of the block access memory can be enhanced.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
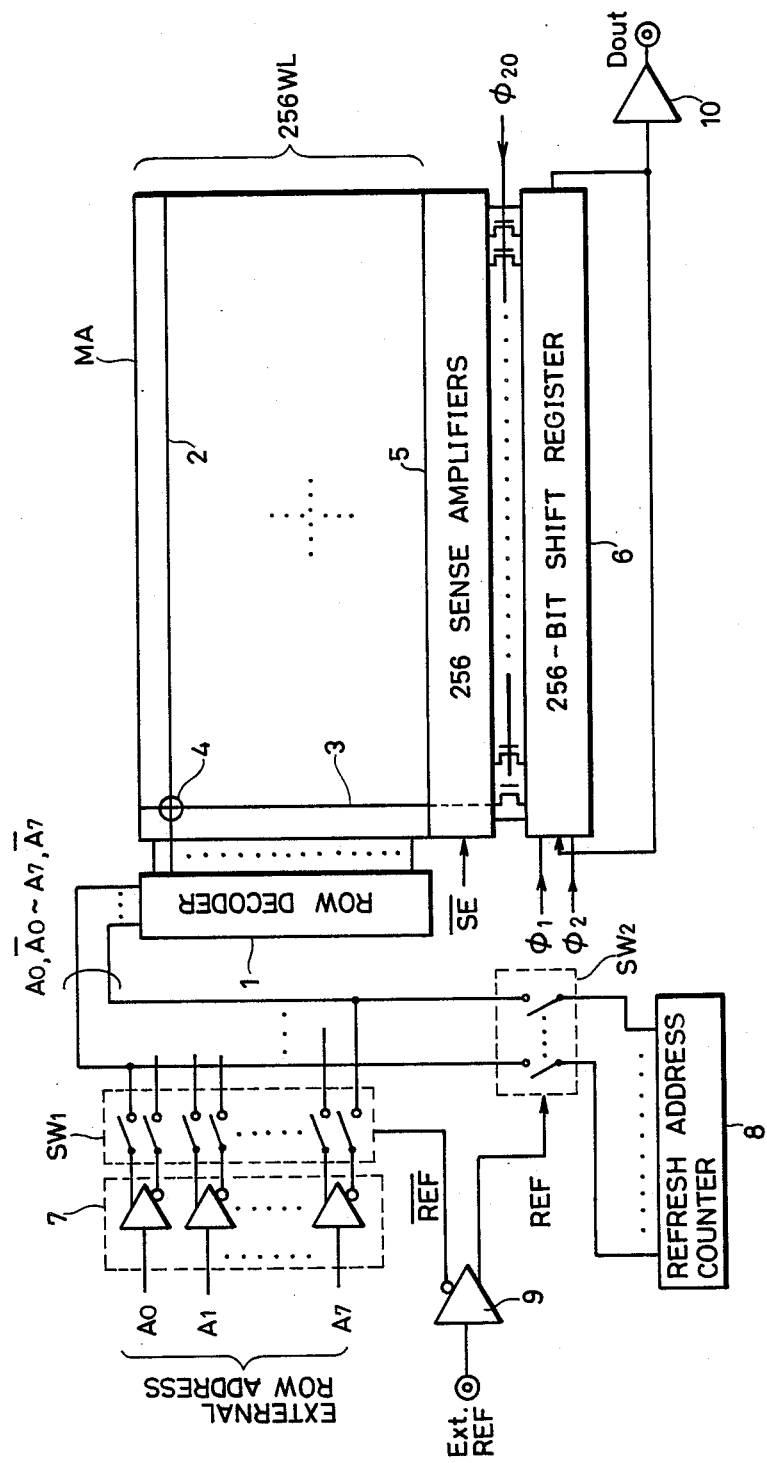
FIG. 1 schematically shows one example of the whole structure of a conventional block access memory.
Figure 2:
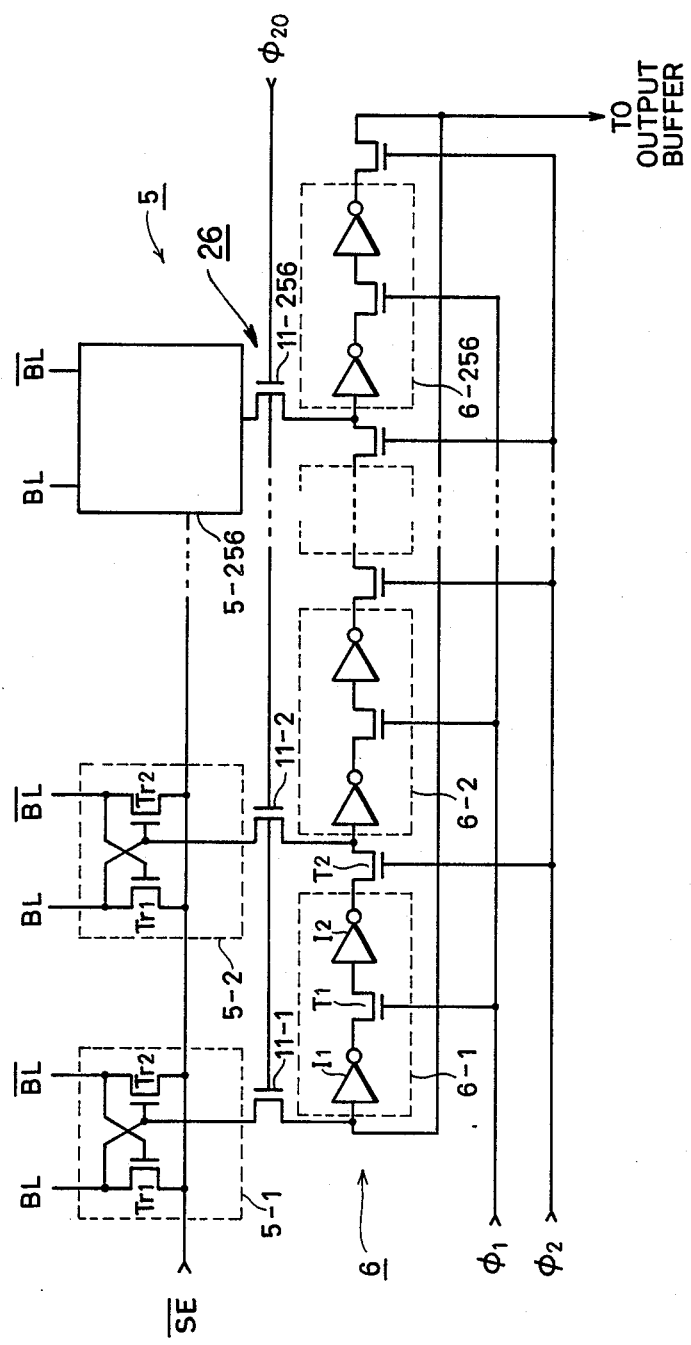
FIG. 2 shows one example of the specific structure of the sense amplifier portion and the shift register portion of the block access memory shown in FIG. 1.
Figure 3:
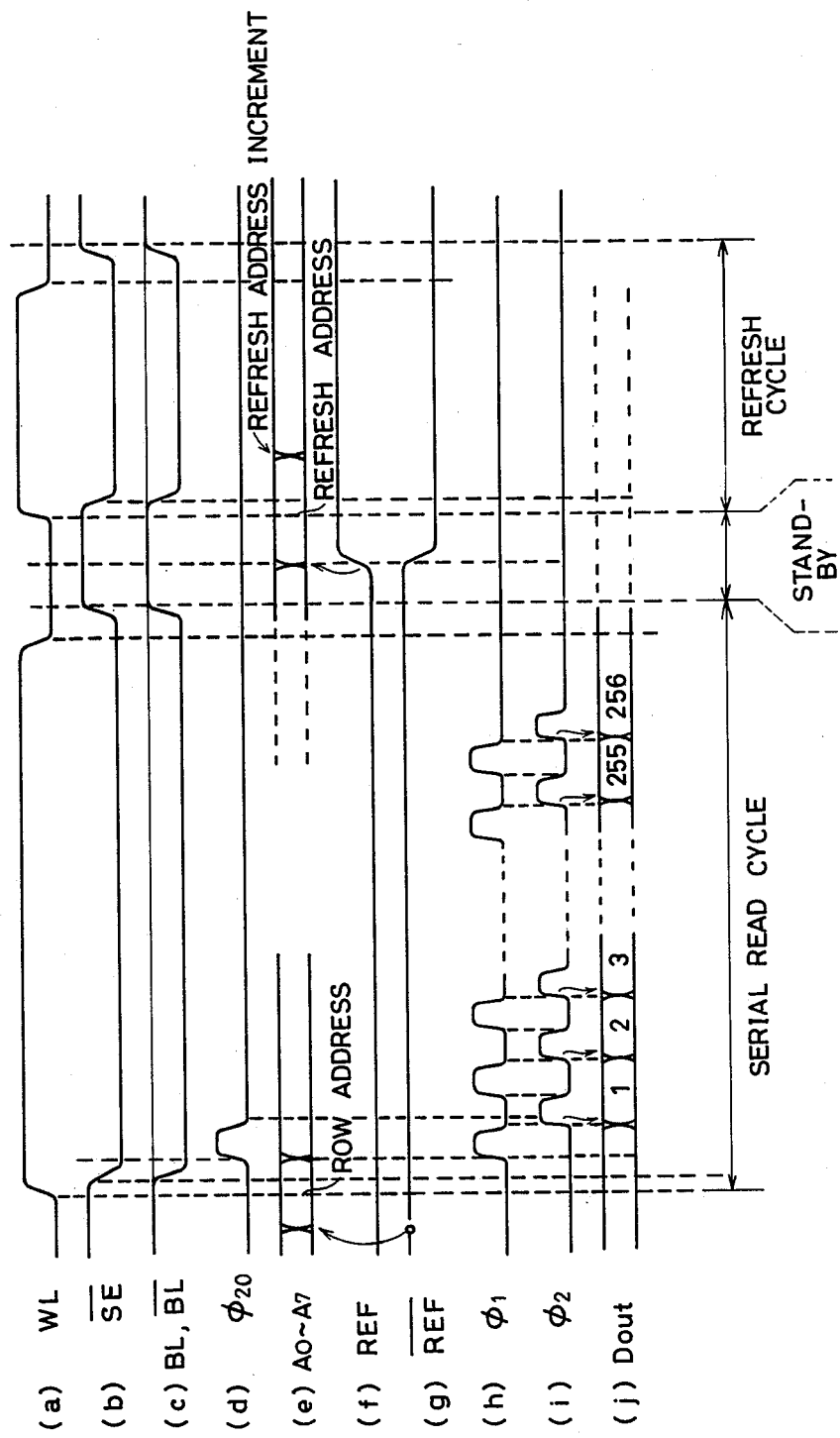
FIG. 3 is a diagram of waveforms showing the operation in reading and refreshing a conventional block access memory.
Figure 4:
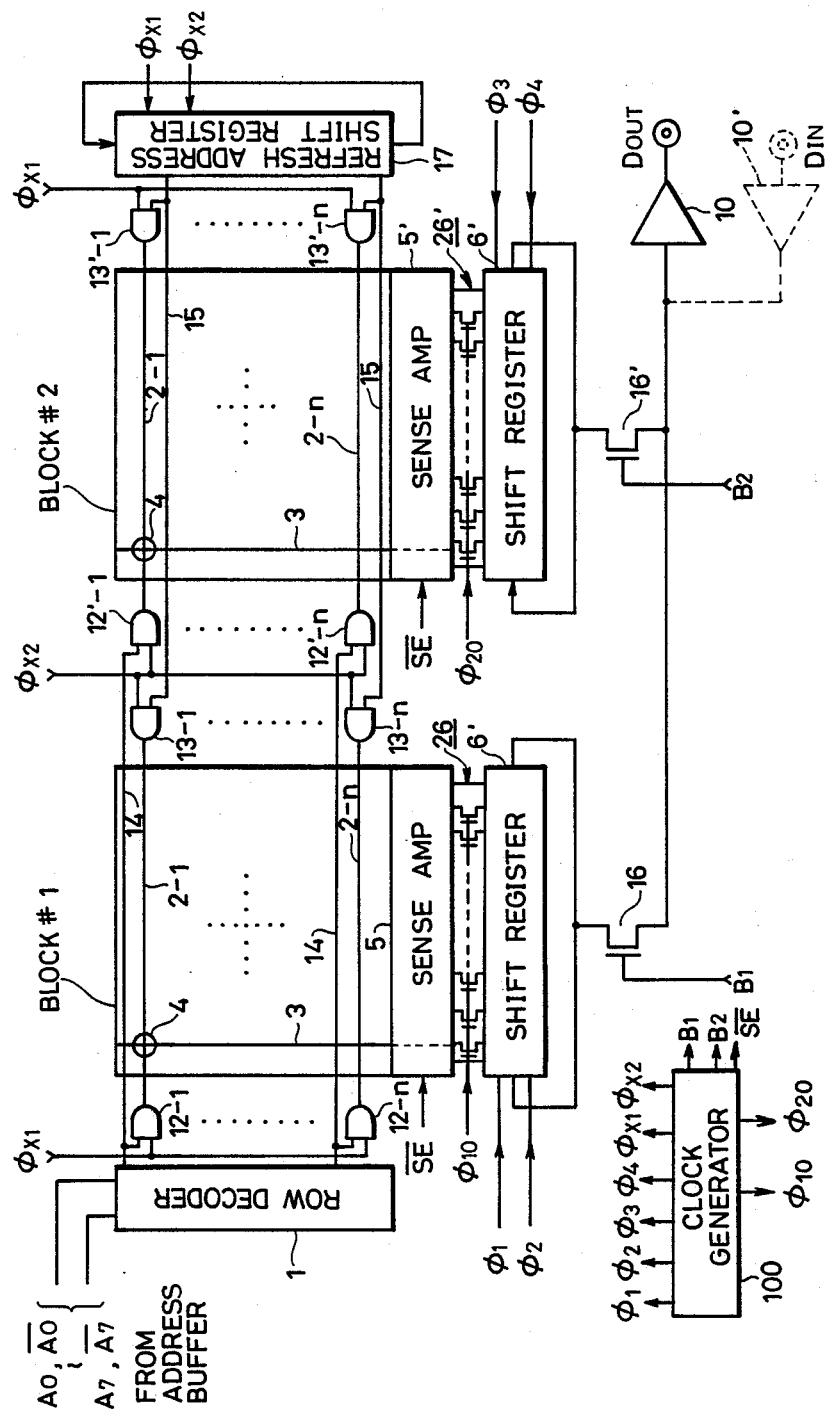
FIG. 4 schematically shows the whole structure of the block access memory in accordance with one embodiment of the present invention.

FIG. 4 shows a structure of the block access memory of one embodiment of the present invention, showing the structure associated with the data reading path.

Referring to FIG. 4, in the block access memory of the present invention, the memory cell array is divided into two blocks, that is, block #1 and block #2. Each of the blocks #1 and #2 comprises a plurality of memory cells 4 arranged in rows and columns each of which stores information, a plurality of word lines 2-1 to 2-n for selecting one row of the plurality of memory cells, a plurality of bit lines 3 to which the information contained in the memory cell connected to a selected word line is transmitted and sense amplifier groups 5 and 5' which detect and amplify the information appearing on the bit lines 3 when activated in response to the sense amplifier activating signal $\overline{SE}$. The output of the sense amplifier group 5 in the block #1 is simultaneously transmitted to the shift register 6 provided corresponding to the block #1 through a switch which turns on in response to the clock $\Phi 10$. A switch 26 which turns on in response to the clock $\Phi 10$ is provided between the shift register 6 and the sense amplifier group 5. The shift register 6 has its input portion and output portion connected to each other to form a loop. The shift register 6 transfers the received signal bit by bit in response to the clocks $\Phi 1$ and $\Phi 2$ generated in response to the clock $\Phi 10$. The output of the shift register 6 is transmitted to the data output buffer 10 through a switch transistor 16 which turns on in response to the block selection signal B1. The output of the sense amplifier group 5' provided corresponding to the block #2 is simultaneously transmitted to the shift register 6' which is provided corresponding to the block #2 through the switch 26' which turns on in response to the clock $\Phi 20$. The shift register 6' has its output portion and input portion connected to each other to form a loop. The shift register 6' shifts the contents bit by bit in response to the clocks $\Phi 3$ and $\Phi 4$. The clocks $\Phi 3$ and $\Phi 4$ are generated by detecting the completion of the shifting operation in the shift register 6 (which can be easily implemented by counting the number of the clocks $\Phi 1$ and $\Phi 2$) or, if the timing of generation of the clock $\Phi 20$ for data transfer corresponds to the timing of a shift in the shift register 6 (preferably the timing corresponding to the clock for transferring the bit immediately before the final bit in the shift register 6, for example, the clock for shifting the 127-th bit in the 128 bit structure shift register 6 and 6'), then the clocks $\Phi 3$ and $\Phi 4$ are generated in response to the clock $\Phi 20$. The output of the shift register 6' is transferred to the data output buffer 10 through the switch transistor 16' which turns on in response to the block selection signal B2.

Each of the word lines 2-1 to 2-n contained in block #1 comprises a corresponding one of a plurality of AND gates 12-1 to 12-n each of which receives the output of the row decoder 1 and the signal $\Phi_{x1}$ for activating a word line at a first timing, and a corresponding one of AND gates 13-1 to 13-n each of which receives the output of the refresh address shift register 17 and a signal $\Phi_{x2}$ for activating a word line at a second timing. Each of the word lines 2-1 to 2-n in block #2 comprises a corresponding one of AND gates 12'-1 to 12'-n each of which receives the output of the row decoder 1 and the signal $\Phi_{x2}$ which activates a word line at the second timing and a corresponding one of AND gates 13'-1 to 13'-n each of which receives the output of the refresh address shift register 17 and the signal $\Phi_{x1}$ which activates the word line at a first timing. The refresh address shift register 17 generates a refresh row address which designates a word line to be refreshed and after the refreshing of the blocks #1 and #2, it automatically increments or decrements the refresh row address.

Various structures may be employed as the refresh address shift register. The shift register of the most preferred structure may be provided with output portions corresponding to each word line, one of which output portions is previously set to a high level with the high level output portion shifted sequentially downward or upward at a predetermined timing.

Figure 5:
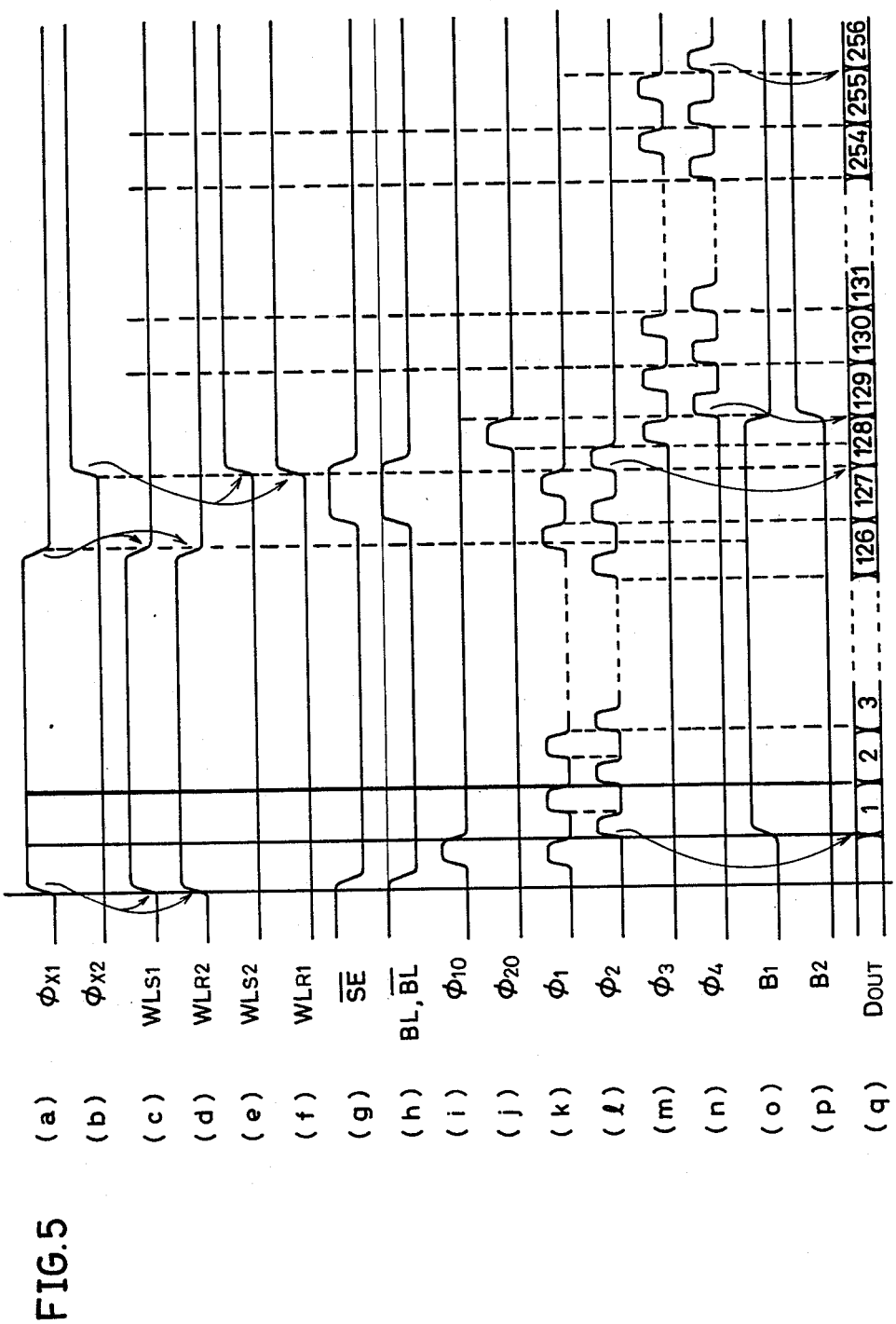
FIG. 5 is a diagram of waveforms showing the operation in reading of the block access memory in accordance with one embodiment of the present invention.

The operation of the block access memory of one embodiment of the present invention will be hereinafter described with reference to FIG. 5, which is a diagram of waveforms of the block access memory of FIG. 4 in reading data. Now, the waveforms of FIG. 5 are for the case in which the memory block #1 is first accessed based on the external address and then the memory block #2 is selected and accessed based on the same external address. Therefore, the block selection signals B1 and B2 and the clock signals $\Phi_{x1}$ and $\Phi_{x2}$ are activated at respective predetermined sequence. Each of the timing signals $\Phi 1$, $\Phi 2$, $\Phi_{x1}$, $\Phi_{x2}$, $\Phi 3$, $\Phi 4$, B1 and B2 is generated by the clock generator 100.

First, external address signals A0 to A7 are taken in the memory chip in response to the activated state of the external $\overline{RAS}$ signal which is the basic timing signal for the memory operation, and complementary address signals A0, $\overline{A0}$ to A7, $\overline{A7}$ are applied to the row decoder 1 through the address buffer which receives the external address signals. One word line is selected by the row decoder 1 based on the address signals A0, $\overline{A0}$ to A7, $\overline{A7}$ and the output of the row decoder corresponding to the selected word line becomes a high level. Meanwhile, based on the refresh row address retained in the refresh address shift register 17, the output of the corresponding refresh address shift register 17 becomes high level. When the output of the row decoder 1 and the output of the refresh address shift register 17 are established, the first word line driving signal $\Phi_{x1}$ becomes high level and is applied to the AND gates 12-1 to 12-n. One of the outputs of the AND gates 12-1 to 12-n becomes high level in response, and one word line $WL_{S1}$ is selected and becomes high level in the block #1. Since the word line driving signal $\Phi_{x2}$ remains low level on this occasion, the outputs of the AND gates 12'-1 to 12'-n and 13-1 to 13-n are at low level. On the other hand, in the block #2, one output of the AND gates 13'-1 to 13'-n becomes high level in response to the output of the refresh address shift register 17 and the first word line driving signal $\Phi_{x1}$, one word line $WL_{R2}$ is selected and the level thereof becomes high. Consequently, the information contained in the memory cells connected to the selected word lines $WL_{S1}$ and $WL_{R2}$ is read onto the bit lines 3. Thereafter, the sense amplifier activating signal $\overline{SE}$ becomes low level and the sense amplifiers 5 and 5' are both activated, and the potential on each of the bit lines 3 becomes high level or low level dependent on the information contained in the selected memory cell. In FIG. 5, the bit lines constitute complementary bit line pairs as in the conventional device and the sense amplifiers are shown with the structure for differentially amplifying the potential difference between a corresponding complementary bit line pair. In addition, the bit lines are shown being precharged at the Vcc (supply potential) level. When the state of the bit lines BL and $\overline{BL}$ is established to be high level or low level, the clock signal $\Phi 10$ becomes high level and the information detected and amplified by the sense amplifier group 5 in the block #1 is transferred to the shift register 6 through the switch 26. The structure of the sense amplifier group 5 and the shift register 6 are assumed to have the same structure as the conventional sense amplifier and the shift register. However, the step number (stage number) thereof is made one half, that is, 128 (in case the serial data is 256 bit). Then, the block selection signal B1 becomes high level, the switch transistor 16 turns on, the information from the shift register 6 is successively applied to the data output buffer 10 in response to the two phase clocks Φ1 and Φ2 generated in response to the clock Φ10, and the 128 bit data of the block #1 is successively outputted serially through the buffer 10. Meanwhile, in the block #2, since the clock Φ20 remains at low level, the refreshing operation is carried out in which the information detected and amplified by the sense amplifier 5' is again written in the memory cells, with the memory cells of one row in block #2 being refreshed.

While the 128 bit data from the shift register 6 is serially outputted successively in response to the clock signals Φ1 and Φ2, the first word line driving signal $\Phi_{x1}$ falls and the sense amplifier activating signal $\overline{SE}$ rises so as to reset (precharge) the bit lines and the sense amplifiers of each of the blocks #1 and #2. On this occasion, the output of the row decoder 1 is not reset. Alternatively, the output of the row decoder 1 may be similarly reset while latching the address in the address buffer and the latched address A0 to A7 and $\overline{A0}$ to $\overline{A7}$ may be once again applied to the row decoder 1. Then, the second word line driving signal $\Phi_{x2}$ rises. Consequently, the word line selection signal for the same row which is selected in the block #1 is applied to the AND gates 12'-1 to 12'-n through the respective output signal lines 14 of the row decoder 1. Simultaneously with the rise of the second word line clock signal $\Phi_{x2}$ to the high level, one word line $WL_{S2}$ is selected in the block #2 and the level thereof rises to the high level. At the same time, the refresh row address from the refresh address shift register 17 is applied to the AND gates 13-1 to 13-n, one word line is selected in accordance with the refresh row address designated by the refresh address shift register 17 in response to the second word line driving signal $\Phi_{x2}$ at high level, and the selected word line $WL_{R1}$ becomes high level in the block #1. Then, the information contained in the memory cells connected to the selected word lines $WL_{S2}$ and $WL_{R1}$ is transmitted to the respective bit lines 3, and the level of each of the bit lines BL and $\overline{BL}$ is established at high level or low level dependent on the logic "1" or "0" of the information contained in the memory cells connected to the selected word lines. When the level on the bit lines BL and $\overline{BL}$ is established by the sensing operation of the sense amplifiers 5 and 5', the clock Φ20 becomes high level and the level on each bit line BL in the block #2 is transferred to the input portion of each stage of the shift register 6' through the switch 26, waiting for outputting. Thereafter, when the serial output from the block #1 is detected to be 128-th bit (or 128 bits), the clocks Φ3 and Φ4 for shifting data from the block #2 are activated, the block selection signal is switched from B1 to B2 simultaneously, and the switch transistor 16' turns on, then the 128 bit data from the block #2 is successively transmitted to the data output buffer 10 serially, following the serial 128 bit from the block #1 without break, so that the 256 bit block data as whole is serially outputted without break in the same manner as in the conventional case. During the reading of the data from the block #2, the memory cells of one row of the selected word line $WL_{R1}$ are refreshed and after the completion of the refreshing, the refresh row address of the refresh address shift register 17 is shifted by 1 bit (incremented or decremented) to be ready for the next cycle. The timing for generating the refresh row address of the refresh address shift register 17 and the timing for shifting the refresh row address may be controlled using the first and second word line driving signals $\Phi_{x1}$ and $\Phi_{x2}$ as shown in FIG. 4 or, alternatively, it may be controlled by the internal $\overline{RAS}$ signal which is generated in synchronization with the external $\overline{RAS}$ signal which provides the timing for taking the external address into the chip. The refresh row address may be continuously outputted and the shifting only may be effected before the start or after the end of the refreshing.

Although in the above described embodiment the memory cell array (256 rows × 256 columns) is divided into two blocks, it is not limited to this and the memory cell array may be divided into any number of blocks to obtain the same effect as in the above described embodiment.

In addition, although in the above described embodiment the description was made of a case in which the data is serially read, it is not limited and the same effect as in the above described embodiment can be obtained in the write cycle in which the data is serially inputted to the shift register and the information is written in the memory cells of one row at one time. The operation timing signal in the write cycle is almost the same as the operation timing signal in the read cycle and the data stream is considered to flow in the reverse direction with the data output buffer replaced with the data input buffer, as shown by the dotted line in FIG. 4.

As described above, according to the present invention, the memory cell array is divided into a plurality of blocks, the access is carried out for each block as a unit based on the external address, and the accessing is carried out for reading or writing the data in the selected block while the refreshing is carried out based on the output of the refresh address shift register in the non-selected block, with each of the blocks connected to the input/output circuits by switching the accessing to the plurality of the blocks at appropriate timings. Therefore, the reading or writing of one bulk of a serial data is seemingly carried out, while the refreshing can be successively carried out actually inside behind the access cycle, so that the operating efficiency in utilizing the block access memory can be enhanced without providing a specific refresh cycle between the read cycles or the write cycles.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An improvement in a block access memory comprising a memory cell array having a plurality of memory cells arranged in rows and columns, a plurality of word lines each of which is connected to an associated row of said plurality of memory cells, a plurality of bit lines each of which is connected to an associated column of said memory cells, said memory capable of simultaneously accessing a plurality of said memory cells connected to one word line selected by an external address, the improvement comprising:
   a plurality of memory blocks provided by dividing said memory cell array so that the memory cells associated with each of said word lines are divided into said blocks, thereby dividing each of said word lines into a plurality of segments;
   detecting amplifying means provided corresponding to each of said plurality of memory blocks for detecting and amplifying a potential on respective bit lines in the associated block;

selective access means for activating a first divided word line segment contained in one block of said plurality of memory blocks in response to the external address and for accessing the memory cells of one row connected to said activated first divided word line by segment by activating the detecting amplifying means of said selected block;

selective refresh means for activating a second divided word line segment included in at least one block of the non-selected blocks out of said plurality of memory blocks based on a separately generated row address in said block access memory and for refreshing the information of the memory cells connected to said activated second divided word line segment by activating the detecting amplifying means provided for the associated block;

said selective access means comprising a plurality of first word line driving means corresponding to each of the memory blocks for transmitting a word line driving signal generated in response to the external address to an associated block, said plurality of first word line driving means being activated at different timings for every block, and said selective refresh means comprising a second word line driving means provided corresponding to each of the memory blocks for transmitting to an associated block a word line driving signal generated in response to said separately generated row address, wherein said second word line driving means activates a divided word line segment at different timing for each block and at a timing which allows one memory block to be accessed in response to said external address and at least one of the remaining memory blocks to be refreshed in parallel.

2. An improved block address memory as recited in claim 1 further including timing signal means for generating first and second sequential timing signals for sequentially accessing memory cells associated with segments of a word line selected by said external address, said segments being in different blocks, and timing means for selecting a non-accessed block, free of accessed memory cells, for refreshing by said selective refresh means.

3. The improvement according to claim 1, wherein said block access memory further comprises register storage means provided corresponding to each of said plurality of blocks for communicating data signals with the corresponding detecting amplifying means, each of said register storage means being successively connected to a data input/output signal line in response to a corresponding block selection signal, whereby serial data from/to said plurality of memory blocks is succcessively inputted/outputted.

4. The improvement according to claim 3, wherein data transfer is carried out between one of said register storage means and said data input/output signal line while accessing is carried out to other blocks by the selective access means.

5. The improvement according to claim 3, wherein each of said first and second word line driving means includes an AND gate.

6. An improved block address memory as recited in claim 1 further including timing signal means for generating first and second sequential timing signals, wherein said first word line driving means comprises first means responsive to said first timing signal for transmitting a word line driving signal to a first segment of an addressed word line in a first block, and second means responsive to said second timing signal for transmitting a word line driving signal to a second segment of said addressed word line in a second block, thereby providing sequential access to memory cells associated with consecutive segments of an addressed word line and in different blocks.

7. An improved block address memory as recited in claim 6 wherein:

said second word line driving means comprises third means responsive to said first timing signal for transmitting a word line driving signal to a second segment of a word line, addressed by said selective refresh means, said second segment being in said second block, and fourth means responsive to said second timing signal for transmitting a word line driving signal to a first segment of said word line addressed by said selective refresh means, said first segment being in said first block, thereby refreshing a word line segment only in a non-selected block simultaneously with accessing a word line segment in a selected block and eliminating simultaneous attempts to access and refresh word line segments in a single block.

8. An improved block address memory as recited in claim 7 wherein:

said first, second, third and fourth means each comprises AND gate means responsive to the respective timing signal associated therewith and to the word line driving signal supplied thereto.

9. A method for driving a block access memory comprising a memory cell array having a plurality of memory cells arranged in rows and columns for storing information, a plurality of word lines each of which is connected to an associated row of said plurality of memory cells, a plurality of bit lines each of which is connected to an associated column of said memory cells, and a plurality of sense amplifiers which detect and amplify the information on respective ones of said plurality of bit lines, said memory capable of simultaneously accessing a plurality of memory cells connected to a single word line in a row selected by an external address, the method comprising the steps of:

arranging a plurality of memory blocks by dividing said memory cell array so that the memory cells associated with each of said word lines are divided into said blocks, thereby dividing each of said word lines into a plurality of; segments in separate blocks;

selecting a corresponding word line segment in one of said plurality of blocks in response to the external address and accessing the memory cells of the selected word line segment, said selecting step comprising generating a first word line driving signal in response to the external address and, in response to successive timing signals, applying said first word line driving signal to corresponding successive word line segments in successive blocks, whereby successive memory cells of a word line are successively and sequentially accessed by sequentially accessing the successive blocks in which the memory cells are located, and concurrently with said selecting step, accessing the memory cells of a different word line segment in a different block from that block to which said selected word line segment belongs in response to a separately generated second word line driving signal and refreshing the memory cells connected to the different word line segment, said step of accessing memory cells of a different word line segment; comprising applying said second word line driving signal to each block in response to a different timing signal than those used to apply said first word line driving signal to successive word line segments, whereby word line segments are refreshed only in non-selected blocks.

10. A method according to claim 9 further comprising the steps of:

serially reading memory cell information from line segments in a selected block accessed based on the external address; and accessing at least one non selected block based on said separately generated row address concurrently with said reading step.

* * * * *